United States Patent
Jarrar et al.

(10) Patent No.: US 11,680,983 B1
(45) Date of Patent: Jun. 20, 2023

(54) INTEGRATED CIRCUIT HAVING AN IN-SITU CIRCUIT FOR DETECTING AN IMPENDING CIRCUIT FAILURE

(71) Applicant: NXP USA, Inc., Austin, TX (US)

(72) Inventors: Anis Mahmoud Jarrar, Austin, TX (US); David Russell Tipple, Leander, TX (US); Emmanuel Chukwuma Onyema, Kyle, TX (US)

(73) Assignee: NXP USA, Inc., Austin, TX (US)

(*) Notice: Subject to any disclaimer, the term of this patent is extended or adjusted under 35 U.S.C. 154(b) by 0 days.

(21) Appl. No.: 17/649,623

(22) Filed: Feb. 1, 2022

(51) Int. Cl.
| | | |
|---|---|---|
| *G01R 31/3177* | (2006.01) | |
| *H03K 3/037* | (2006.01) | |
| *H03K 19/20* | (2006.01) | |
| *H03K 5/01* | (2006.01) | |
| *G01R 31/317* | (2006.01) | |
| *H03K 19/003* | (2006.01) | |
| *H03K 5/00* | (2006.01) | |

(52) U.S. Cl.
CPC ... *G01R 31/3177* (2013.01); *G01R 31/31723* (2013.01); *H03K 3/037* (2013.01); *H03K 5/01* (2013.01); *H03K 19/003* (2013.01); *H03K 19/20* (2013.01); *H03K 2005/00019* (2013.01)

(58) Field of Classification Search
CPC .......... G01R 31/3177; G01R 31/31723; H03K 3/037; H03K 5/01; H03K 19/003; H03K 19/20; H03K 2005/00019
See application file for complete search history.

(56) References Cited

U.S. PATENT DOCUMENTS

| 8,555,124 B2 | 10/2013 | Idgunji et al. |
| 8,686,773 B1 | 4/2014 | Zhang et al. |
| 9,229,054 B2 | 1/2016 | Bowman et al. |
| 10,114,068 B1 | 10/2018 | Chen et al. |
| 10,585,143 B2 | 3/2020 | Urard et al. |

(Continued)

FOREIGN PATENT DOCUMENTS

| EP | 0782293 A2 | 7/1997 |
| WO | WO-2019106226 A1 | 6/2019 |

OTHER PUBLICATIONS

Y. Shi and N. Togawa, "In-situ timing monitoring methods for variation-resilient designs," 2014 IEEE Asia Pacific Conference on Circuits and Systems (APCCAS), Ishigaki, Japan, 2014, pp. 735-738. (Year: 2014).*

(Continued)

*Primary Examiner* — Cynthia Britt (57) ABSTRACT

A critical data path of an integrated circuit includes a flip flop configured to receive a data input and provide a latched data output. A monitoring circuit includes a delay generator configured to receive the data input and provide a plurality of delayed data outputs corresponding to delayed versions of the data input with increasing amounts of delay, a selector circuit configured to select one of the plurality of delayed outputs based on a programmable control value, and a shadow latch coupled to an output of the selector circuit and configured to latch a value at its input to provide as a latched shadow output. A comparator circuit provides a match error indicator based on a comparison between the first latched data output and the latched shadow output, and an error indicator is provided which indicates whether or not an impending failure of the critical data path is detected.

20 Claims, 5 Drawing Sheets

(56) References Cited

U.S. PATENT DOCUMENTS

| | | |
|---|---|---|
| 2007/0168848 A1 | 7/2007 | Tschanz et al. |
| 2011/0302460 A1* | 12/2011 | Idgunji .............. G01R 31/3016 714/E11.024 |
| 2014/0115408 A1* | 4/2014 | Andrejic ................ G06F 1/324 714/E11.024 |

OTHER PUBLICATIONS

M. Ahmadi, S. Salamatand B. Alizadeh, "A Dynamic Timing Error Avoidance Technique Using Prediction Logic in High-Performance Designs," in IEEE Transactions on Very Large Scale Integration (VLSI) Systems, vol. 27, No. 3, pp. 734-737, Mar. 2019. (Year: 2019).*

Benhassain et al.: "Timing in-situ Monitors: Implementation Strategy and Applications Results", IEEE, 2015 IEEE Custom Integrated Circuits Conference (CICC), Sep. 28-30, 2015, San Jose, CA, USA, pp. 1-4.

Huard et al.: "Adaptive Wear-out Management with In-Situ Aging Monitor", IEEE, 2014 IEEE International Reliability Physics Symposium, Jun. 1-5, 2014, Waikoloa, HI, USA, pp. 6B.4.1-6B.4.11.

Shah et al.: "Aging Investigation of Digital Circuits using In-Situ Monitor", IEEE, 2018 International Integrated Reliability Workshop (IIRW), Oct. 7-11, 2018, South Lake Tahoe, CA, USA, pp. 1-4.

\* cited by examiner

INTEGRATED CIRCUIT HAVING AN IN-SITU CIRCUIT FOR DETECTING AN IMPENDING CIRCUIT FAILURE

BACKGROUND

Field

This disclosure relates generally to integrated circuits, and more specifically, to an in-situ circuit for detecting an impending circuit failure.

Related Art

Silicon devices, such as integrated circuits, generally age with use. This aging effect slows down the functional operation of the device by, for example, increasing delay time of the signal paths on the device. When the device ages, some paths will increase in delay to the point of failure. However, it is not known at design time which path will fail first, but the failure is dependent upon how the device is being used in an application. Failure of the device can lead to catastrophic events, especially in life critical applications such as auto drive support, adaptive breaking support, and other similar life critical applications. Therefore, there is a need for a detection circuit which can provide warning that the device is nearing failure, which may allow for remedy or prevention of the failure.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In many devices, a top percentage (e.g. the top 1%) of the most timing critical paths can be identified. Testing circuitry can be used to monitor the critical data paths during functional operation and identify when one of the paths is nearing the failure point. In response to such identification, appropriate action can be taken, such as providing maintenance warnings, providing disabling capabilities, or even controlling a shut down process. Therefore, in one embodiment, testing circuitry flags an error when the data path nears the limits of the path's required timing. That is, the test circuitry flags an error when a failure is about to happen. In one aspect, the path's data setup margin is statically selectable based on the clock rates and the desired margin by selecting a set of delay circuits to delay the test data. The test data, in combination with the flip flop in the actual monitored data path of the SoC, is used by the testing circuitry to flag an impending failure in the data path. This can be done without requiring any design changes to the flip flops of the monitored data paths.

Figure 1:
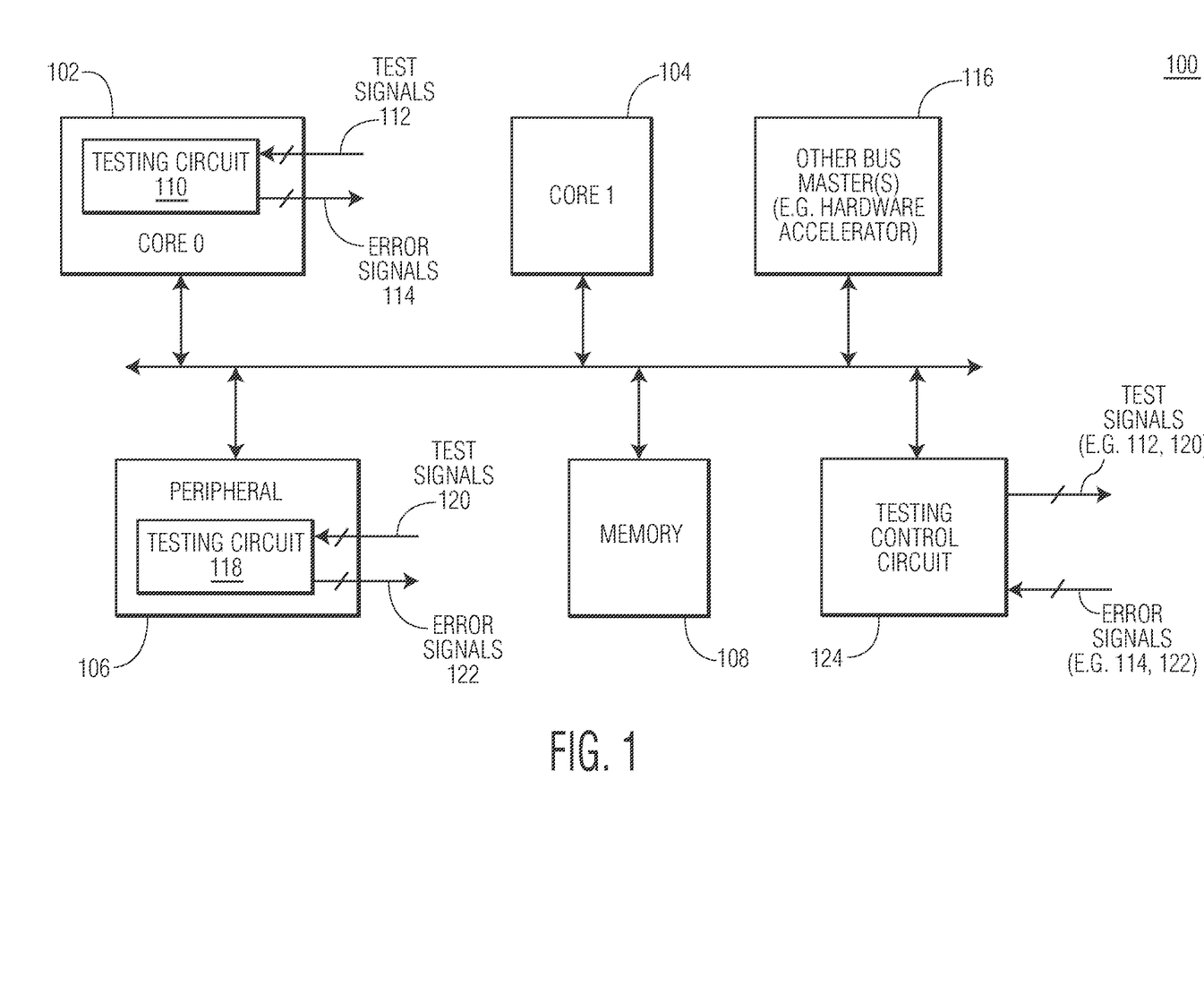
FIG. 1 illustrates, in block diagram form, a system on a chip (SoC) including testing circuitry in accordance with one embodiment of the present invention.

FIG. 1 illustrates, in block diagram form, an SoC 100 in accordance with one embodiment of the present invention. SoC 100 can be implemented as an integrated circuit which includes any number of semiconductor devices which generally age with use. In the illustrated embodiment, SoC 100 includes a first core 102 (core 0) and a second core 104 (core 1). Although only two cores are illustrated, SoC 100 can include any number of cores, and each core can be any type of core. SoC 100 may also include any number of other bus master(s) 116 (or, alternatively, may not include any other bus masters). One of these other bus masters may include, for example, a hardware accelerator. SoC 100 may also include a peripheral 106, and a memory 108. While only one peripheral and one memory are illustrated, SoC 100 may include any number and type of peripherals and may include any number and type of memories. Therefore, SoC 100 is only provided as an example of an SoC, in which other SoCs or other integrated circuits may include more or fewer elements, or different elements than those illustrated.

Any of the elements of SoC 100 may include one or more functional data paths which need to be monitored for impending failure. In one embodiment, it is those data paths identified as the most critical timing paths of an element that are monitored for impending failure. For example, in the illustrated embodiment of FIG. 1, monitored data paths may be located in core 0 and in peripheral 106. Referring to core 0, one of the monitored data paths has a corresponding testing circuit 110 which receives test signals 112 (including test control signals) and provides one or more error signals 114, in which the provided one or more error signals identify when failure is imminent in the corresponding monitored data path. Similarly, one of the monitored paths of peripheral 106 has a corresponding testing circuit 118 which receives test signals 112 and provides one or more error signals 122. Any of the elements of SoC 100 may include any number of monitored data paths, in which each monitored data path would have its corresponding testing circuit, in which each corresponding testing circuit receives test signals and provides one or more error signals. SoC 100 also includes a testing control circuit 124, which may or may not be coupled to the system interconnect which is coupled to core 0 102, core 1 104, other bus masters 116, peripheral 106, and memory 108. Testing control circuit 124 may reside anywhere in SoC 100, or may be distributed within SoC 100. Testing control circuit 124 provides the required test signals to the testing circuits, and receives the error signals from the testing circuits to process them accordingly. For example, testing control circuit 124 may generate interrupts or initiate a system reset. In one embodiment, the control values used by testing control circuit 124 to provide the testing control signals may be programmed by one of the bus masters of SoC 100, such as core 0. The test signals and error signals may be communicated via side band signals or via the system interconnect. In one embodiment, SoC 100 may also include one ore more fault control units which receive some or all of the one or more error signals from the testing circuits, and may take appropriate actions based on the received error signals, such as performing a system reset of SoC 100, performing indicators or warnings external to SoC 100, logging appropriate information, etc.

Figure 2:
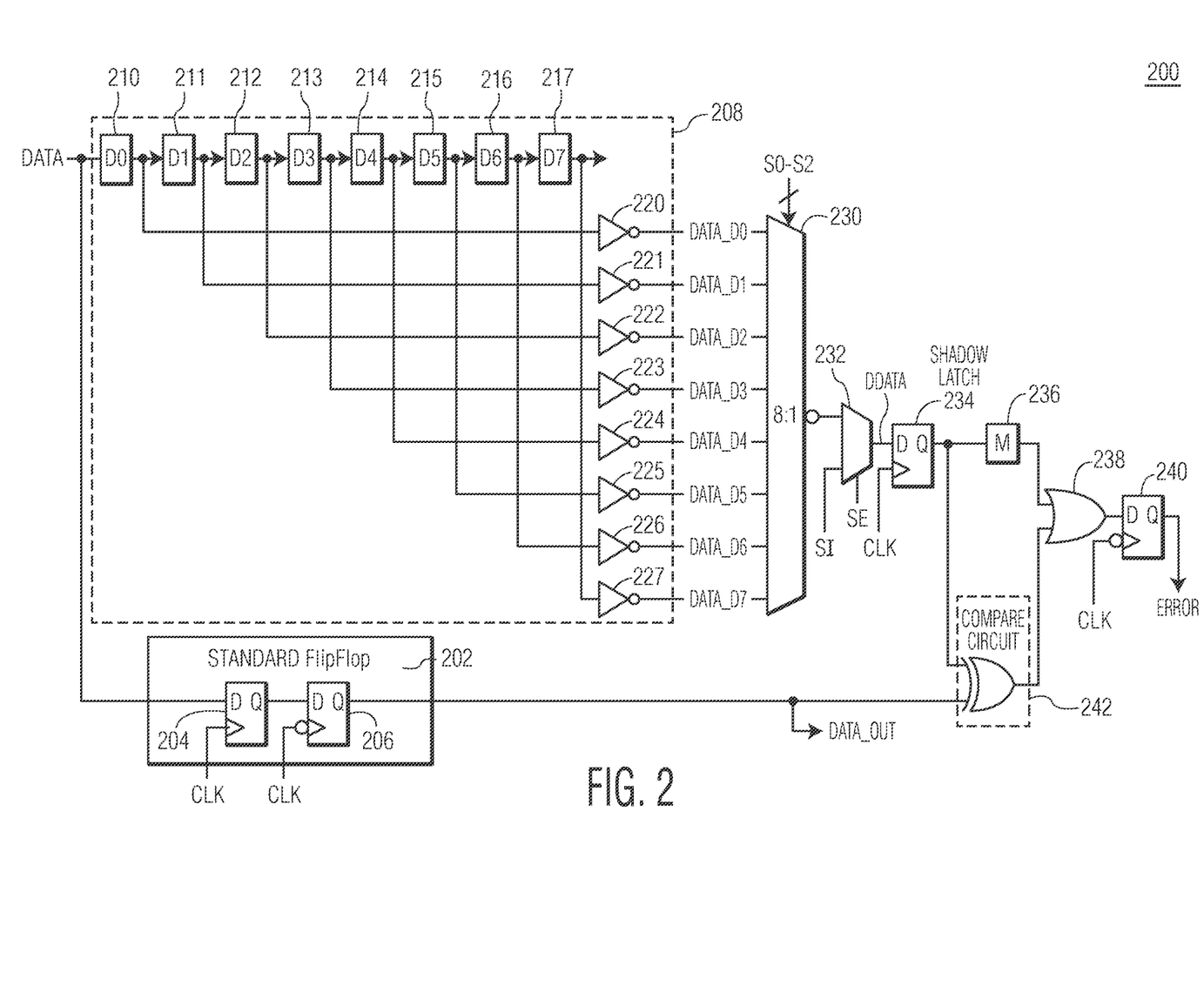
FIG. 2 illustrates, in block diagram form, a standard flip flop along with corresponding testing circuitry, including delay generation circuitry, of the SoC of FIG. 1, in accordance with one embodiment of the present invention.

FIG. 2 illustrates a standard flip flop 202, which can be located in a monitored functional data path in any of the elements of SoC 100, along with corresponding testing circuit 200. In the current example, it is assumed that standard flip flop 202 is within a data path (e.g. identified as a critical data path or critical timing path) of core 0, and testing circuit 200 is a portion of testing circuit 110 within core 0. Testing circuit 200 (which may also be referred to as a monitoring circuit) is coupled to flip flop 202 and includes a delay generator 208, an 8:1 multiplexor (MUX) 230, a 2:1 MUX 232, a shadow latch 234, a metastability detection circuit (M) 236, an OR circuit 238, a compare circuit 242, and an error latch 240. Delay generator 208 receives an incoming bit of data, DATA, and includes 8 daisy-chained delay units D0 210-D7 217 as well as 8 inverters 220-227. DATA is propagated through the delay units, in which each delay unit of delay units 210-217 provides an output to a corresponding inverter 220-227, respectively. Each inverter of inverters 220-227 provides a corresponding delayed data output, DATA_D0 to DATA_D7, respectively. Since the delay units are daisy chained, the delays of the delay units are additive with each output. For example, DATA_D0 is generated from DATA delayed by delay unit D0, while DATA_D2 is generated from DATA delayed by delay units D0+D1+D2. Similarly, DATA_D6 is generated from DATA delayed by delay units D0+D1+D2+D3+D4+D5+D6. The outputs of inverters 220-227 are provided to MUX 230, in which inverters 220-227 at the output of each delay unit help to sharpen the value of DATA provided to MUX 230. Each delay unit provides a monotonic amount of delay (i.e. an increasing delay), irrespective of rising or falling data edges, and are immune from aging effects, as will be described in more detail below in reference to FIG. 3.

Because there are 8 taps in the daisy chain of delay generator 208 (corresponding to the outputs of D0-D7), MUX 230 is implemented as an 8:1 MUX, in which one of the inputs to MUX 230 is selected based on a 3-bit control signal, S0-S2, which may be received from testing control circuit 124 as part of test signals 112. In this manner, by programming the values of S0-S2, a particular tap of the daisy chain can be selected to provide a delayed DATA value, in which each of DATA_D0 up to DATA_D7 provides an increasing delay for the delayed DATA value, in equal incremental steps. Therefore, delay generator 208 along with MUX 230 implement a programmable delay generator, programmed by the received control signals S0-S2. The selected delayed DATA value is inverted at the output of MUX 230 (since the inputs were provided via inverters 220-227) and provided to a first input of MUX 232. A second input of MUX 232 receives a scan-in (SI) data value, and a control signal, scan enable (SE) determines whether the output of MUX 230 is provided at the output of MUX 232 as DDATA or the SI data value is provided as DDATA. During normal operation, when scan testing is not occurring (SE=0), the output of MUX 230 is provided as DDATA, and during scan testing (SE=1), SI is provided as DDATA.

Shadow latch 234 is implemented as a D flip flop in which a data input (D) receives DDATA from MUX 232 and a data output (Q) provides its latched shadow value to M 236. (Note that the data output (Q) of shadow latch 234 may also be referred to as the latched shadow output.) M 236 (described in more detail in reference to FIG. 4 below) provides an output to a first input of OR circuit 238. In one embodiment, standard flip flop 202 is implemented as a standard master-slave D flip flop including a master latch 204 and a slave latch 206, in which the data input (D) of master slave 206 receives DATA as the input to standard flip flop 202, and the data output (Q) of slave latch 206 provides DATA_OUT as the output of standard flip flop 202. Master latch 204 receives CLK at its clock input, and shadow latch 206 receives an inverse of CLK at its clock input, as indicated by the bubble on the clock input. DATA_OUT is the data provided to the next element in the functional data path of core 0. The data outputs of standard flip flop 202 and of shadow latch 234 are provided to compare circuit 242. An output of compare circuit 242 is provided to a second input of OR circuit 238. The output of compare circuit 242 can be referred to as a match error indicator. An output of OR circuit 238 is provided to a data input (D) of error latch 240, and a data output (Q) of error latch 240 provides an error indicator (also referred to as an error flag) which indicates whether or not a failure is about to happen (e.g. is imminent). In the illustrated embodiment, each of shadow latch 234 and standard flip flop 202 operate in according with a same clock signal, CLK. (Master-slave flip flop 202 operates as known in the art, in which, e.g., master latch 204 and slave latch 206 may latch the DATA in different phases of CLK.) Error latch 240 receives an inverse of CLK, as indicated by the bubble on the clock input.

In operation, shadow latch 234 is intended to shadow the received DATA value stored in standard flip flop 202 of the monitored data path, in that DATA is latched in both at the same time (i.e. at the same edge of CLK). However, if DATA arrives too late to shadow latch 234 (e.g. as DDATA), in violation of its required setup time, shadow latch 234 will not successfully latch DATA. A tap of delay generator 208 is programmably controlled using S0-S2 in order to vary the data set up timing margin to shadow latch 234. The values of S0-S2 can be set (by, for example, testing control circuit 124) to select a desired setup timing margin for shadow latch 234, which may correspond to a shortest tolerable setup timing margin for proper operation of the data path. For example, the last tap of delay generator 208 corresponds to the longest delay of the data generated by delay generator 208, and thus the shortest data set up timing margin. If the last tap is selected, DATA_D7 (having the longest delayed time for DATA) is provided to shadow latch 234 via MUX 232. Each of standard flip flop 202 and shadow latch 234 latch a value at their input with respect to a same clock edge of CLK. If compare circuit 242 determines that the outputs of shadow latch 234 and standard flip flop 202 match (e.g. that the latched shadow output equals DATA_OUT), then compare circuit 242 negates the match error indicator to a zero, indicating that the timing margin was successfully met (i.e. no error). However, if there is not a match, the margin was not successfully met, in which case, compare circuit 24 asserts the match error indicator to a one to indicate a warning or error that failure will soon occur.

In one embodiment, M 236 and OR circuit 238 are not present such that the output of compare circuit 242 is provided directly to error latch 240. In this example, if compare circuit 242 detects a match (e.g. match error indicator=0), a zero is latched in latch 240 and provided as the error indicator at the output of latch 240 to indicate no error, otherwise (e.g. match error indicator=1), a one is latched in latch 240 and provided as the error indicator at the output of latch 240 to indicate an error. When the error indicator is asserted (e.g. provided as a logic level one), the setup margin provided by the selected delay (selected by S0-S2) has failed, meaning that the data path is close to failing. A user of SoC 100 can set S0-S2 to select the tap that provides the minimum required setup margin such that when DATA_OUT no longer matches the output of shadow latch 234, a warning is provided by asserting the error indicator. Compare circuit 242 can be implemented with any circuitry to perform its function (e.g. the function of an XOR gate). In one embodiment, compare circuitry 242 may use analog circuitry to provide this functionality, which typically requires fewer circuit elements as compared to using digital circuitry.

In another embodiment, as illustrated in FIG. 2, the output of shadow latch 234 is also provided to M 236 which determines whether the latched shadow value (corresponding to the latched value of DDATA from MUX 230) lacks metastability. For example, it is possible that at a selected delay value for DATA, the latched value of DDATA may not properly be in either a logic high state nor a logic low state, but indeterminately somewhere in between. This is also problematic, indicating pending failure of the data path. Therefore, M 236 is a circuit which determines whether or not the latched value of DDATA indicates a metastable error, in which M 236 outputs a metastable error indicator as a one when there is a metastable error or a zero if there is not. OR circuit 238 receives the metastable error indicator and the match error indicator and provides an error value to latch 240. In one embodiment, OR circuit 238 operates as a logical OR, outputting a one as the error value which is latched by error latch 240, indicating occurrence of an error, if at least one of the output of compare circuit 242 or the metastable error indicator is a one. Otherwise, OR circuit 238 outputs a zero as the error value which is latched into error latch 240, indicating no error. That is, the error indicator at the output of latch 240 is asserted to a one to indicate an impending failure if either the outputs of shadow latch 234 and standard flip flop 202 do not match or if M 236 indicates a metastable error, and is negated to a zero otherwise. Note that since the error indictor indicates the existence or not of an impending failure (rather than an actual failure of the data path), it may also be referred to as a warning indicator, and the circuitry including M 236, compare circuit 242, and OR circuit 238 may be referred to as warning generation circuitry for the data path.

Figure 3:
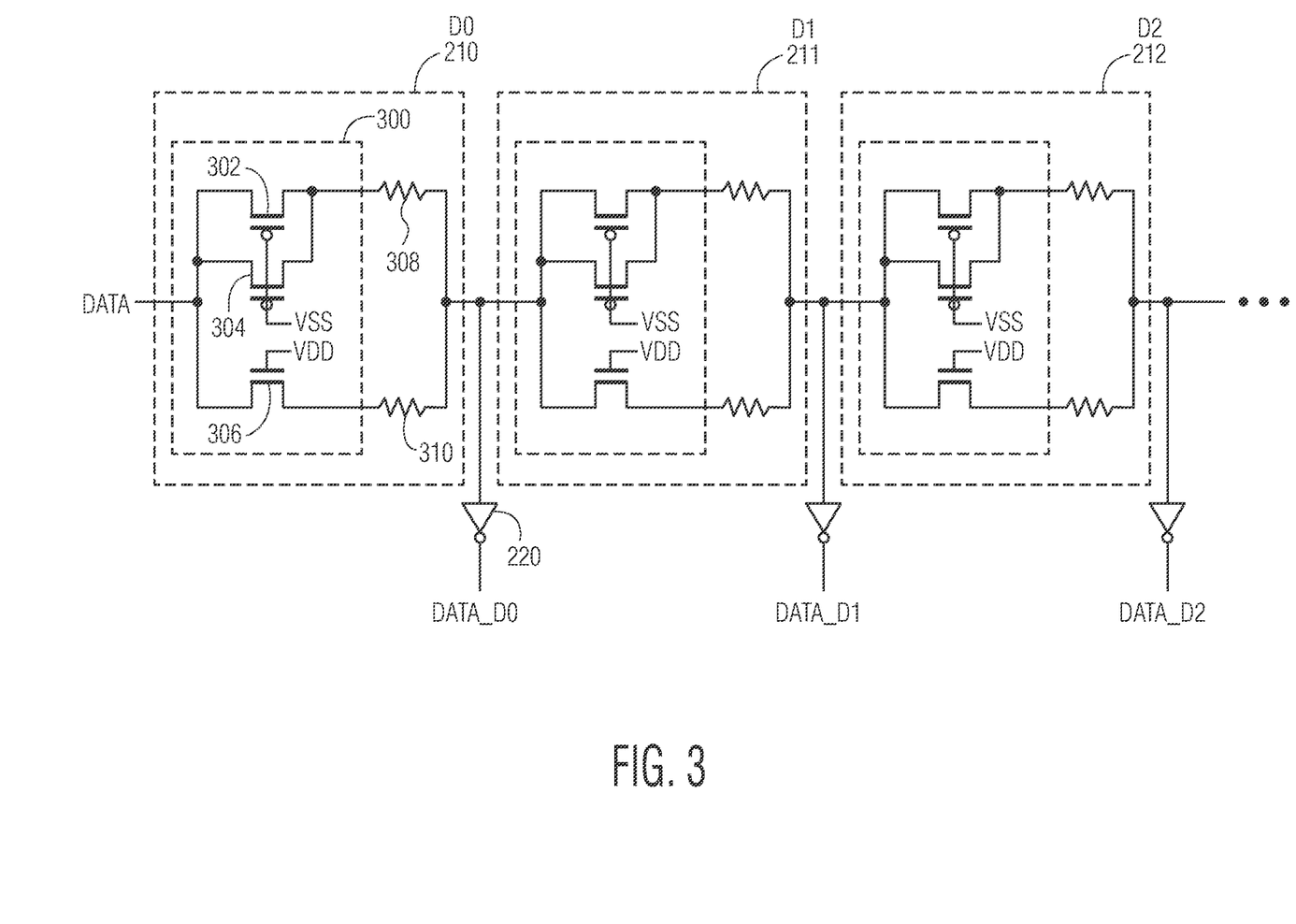
FIG. 3 illustrates, in schematic form, the delay generation circuitry of FIG. 2, in accordance with one embodiment of the present invention.

FIG. 3 illustrates, in schematic form, delay generator 208 in accordance with one embodiment of the present invention, including delay units D0, D1, and D2. Note that the remaining data units of delay generator 208, D3-D7, may have the same form as each of D0-D2. Connectivity and functionality of each delay unit will be described in reference to D0. The same descriptions, though, apply analogously to each of D1-D7. Further, in other embodiments, delay generator 208 can have any number of delay units, depending on the number of taps desired for the delayed DATA, in which each delay unit can be analogous to D0 as well.

Delay unit D0 includes a transmission gate 300 coupled between a data input of D0 and a data output of D0. D0 also includes resistive elements 308 and 310 between transmission gate 300 and the output of D0. Note that the output of D0 is coupled to the input of D1, and is provided as an input to inverter 220. The input of D0 receives DATA. Transmission gate 300 includes an n-type metal oxide semiconductor (NMOS) transistor 306 coupled in parallel with p-type metal oxide semiconductor (PMOS) transistors 302 and 304. Transistor 306 has a first current electrode coupled to the input of D0, a second current electrode connected to a first terminal of resistive element 306, and a control electrode coupled to a first voltage supply terminal. Transistors 302 and 304 each have a first current electrode connected to the input of D0, a second current electrode coupled to a first terminal of resistive element 308, and a control electrode coupled to a second voltage supply terminal. The first voltage supply terminal provides a first supply voltage, VDD, and the second voltage supply terminal provides a second voltage supply, VSS, which is less than VDD. (Note that each of the first and second voltage supply terminals may also be referred to as VDD and VSS, respectively.) VSS at the control electrodes of transistors 302 and 304 maintains each of transistors 302 and 304 in the conductive state (ON), and VDD at the control electrode of transistor 306 maintains transistor 306 in the conductive state (ON).

In the illustrated embodiment, two PMOS transistors are used in parallel with only one NMOS transistor due to the weaker drive strength of PMOS transistors compared to NMOS transistors so as to evenly transmit DATA at either a logic level high or a logic level low. This maintains the delay time through transmission gate 300 consistent regardless of whether DATA is a one or a zero. Also, the use of transmission gates results in D0 providing a monotonic delay that is immune to the effects of aging. Further, resistive elements such as resistive elements 308 and 310, which may be implemented as metal resistors which are also immune to aging, can be used to increase the delay through each delay unit. With transistors 302, 304, and 306 turned ON, DATA is transmitted from the input of D0 to the output of D0 with a delay time determined by delay through transmission gate 300 and resistive elements 308/310, and then to the input of D1 through to the output of D1, then to the input of D2 through to the output of D2. In the illustrated embodiment, each unit adds an additional delay (of the same amount) to DATA such that the output of each delay unit D0-D7 increases in fixed steps. In this manner, DATA_D2 is a delayed version of DATA_D1, which is a delayed version of DATA_D0.

In the illustrated embodiment, the transmission gate of each delay unit operates as a resistive element. In an alternate embodiment, each delay unit may include only a resistive element, such as a metal resistor, instead of a transmission gate. Alternatively, other elements may be used in each delay unit to provide a delay, but these elements should also be elements or configuration of elements which are not affected, or are only minimally affected, by aging of the SoC.

Figure 5:
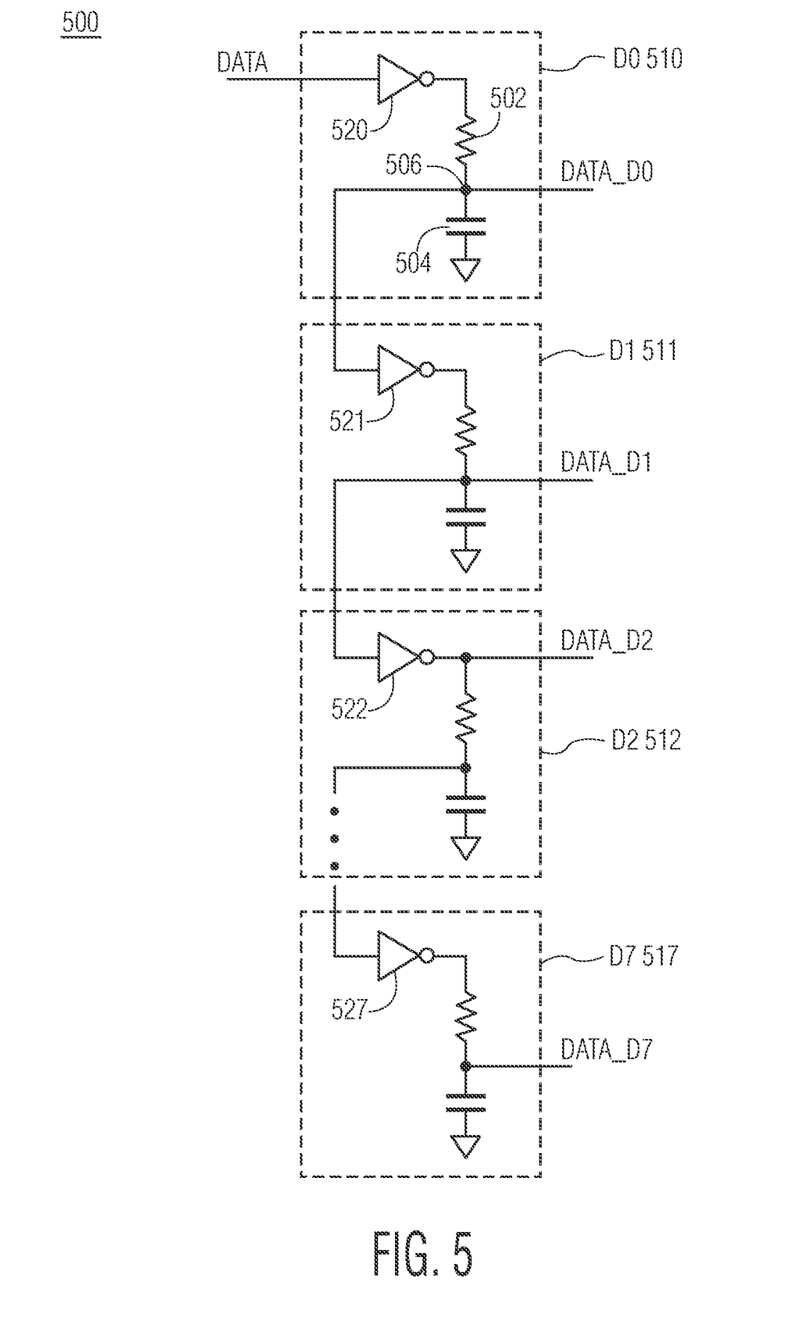
FIG. 5 illustrates, in schematic form, the delay generation circuitry of FIG. 2, in accordance with one embodiment of the present invention

FIG. 5 illustrates, in schematic form, delay generator 500 in accordance with one embodiment of the present invention, in which delay generator 500 is another example for implementing delay generator 208 of FIG. 2, using resistors and capacitors instead of transmission gates. Similar to delay generator 208, delay generator 500 receives DATA and includes 8 daisy chained delay units D0 510-D7 517. Delay units D0 510-D7 517 provide outputs DATA_D0-DATA_D7, which, as illustrated in FIG. 2, are provided to MUX 230. Delay generator 500 of FIG. 5 illustrates delay units D0, D1, D2, and D7. Note that the remaining data units of delay generator 500, D4-D7, may have the same form as each of D0-D2 and D7. Connectivity and functionality of each delay unit will be described in reference to D0. The same descriptions, though, apply analogously to each of D1-D7. Further, as with delay generator 208, in other embodiments, delay generator 500 can have any number of delay units, depending on the number of taps desired for the delayed DATA, in which each delay unit can be analogous to D0 as well.

Delay unit D0 510 includes an inverter 520, a resistor 510, and a capacitor 504. Inverter 520 has an input coupled to an input of D0 and an output coupled to a first terminal of resistor 502. A second terminal of resistor 502 is coupled to a first terminal of capacitor 504 at a circuit node 506. A second terminal of capacitor 504 is coupled to VSS (e.g. ground). Circuit node 506 is coupled to an output of D0, which provides DATA_D0. Delay units D0 510-D7 517 are daisy chained, therefore the output of D0 is coupled to the input of D1 (to an input of the inverter of D1), the output of D1 is coupled to the input of D2 (to an input of the inverter of D2), etc. Resistor 502 and capacitor 504 form an RC filter, in which the delay of DATA_D0 from DATA is determined by the delay through inverter 520 and the RC constant of the RC filter. Therefore, the inverter in combination with the RC filter of the delay units provide the monotonic delays (e.g. increasing delays) for producing DATA_D0-DATA_D7. As with the transmission gates, the delay units of delay generator 500 provide monotonic delays which are immune to the effects of aging. Note that inverters 520-527, each within its corresponding delay unit, correspond to inverters 220-227 of delay generator 208, but are instead located within the daisy chained delay units, at the inputs of the delay units, rather than located at the output of each delay unit. Also, note that any combination of one or more resistive elements may be used to implement each resistor of D0-D7 and any combination of one or more capacitor elements may be used to implement each capacitor of D0-D7.

Figure 4:
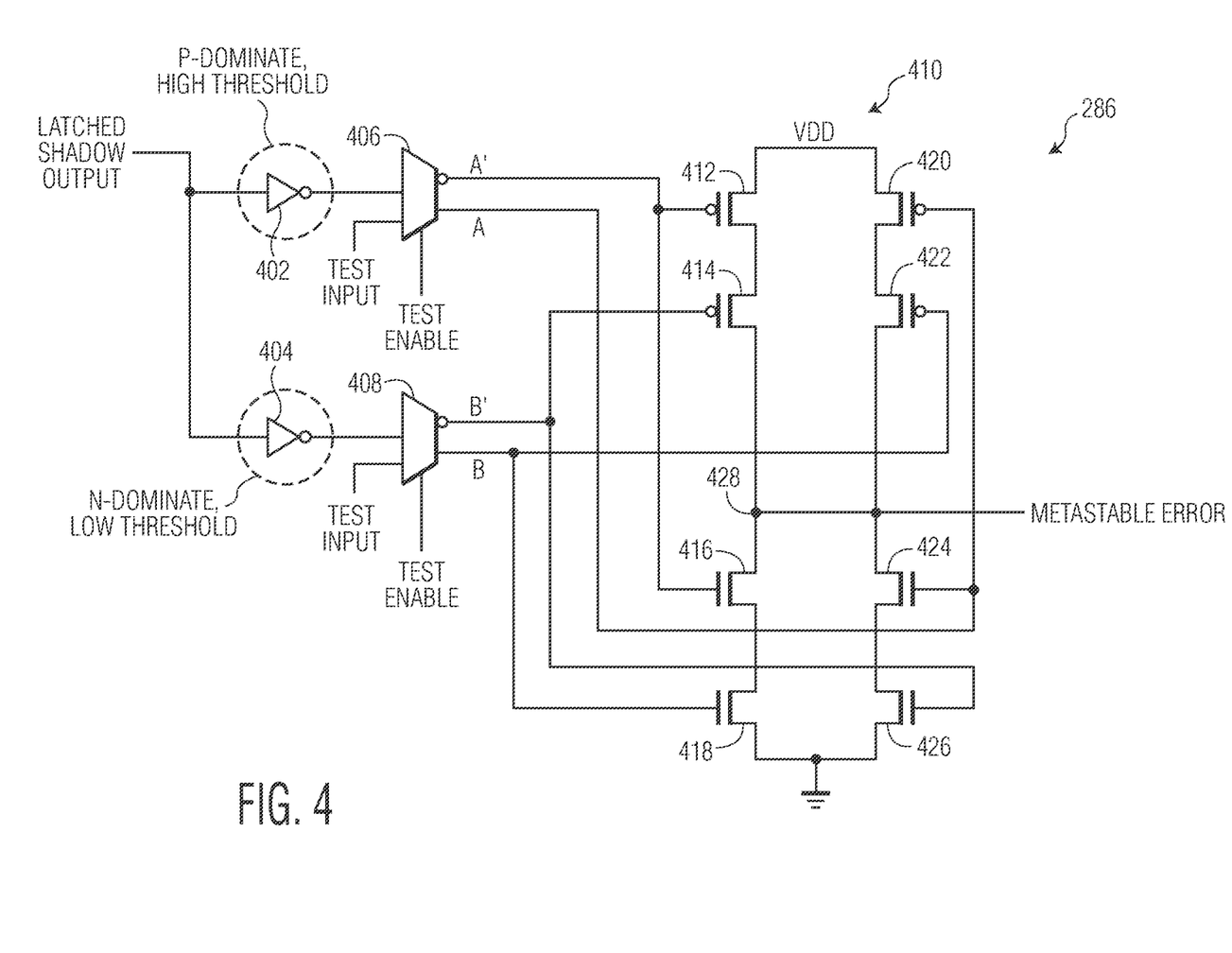
FIG. 4 illustrates, in schematic form, metastability detection circuit used within testing circuitry of the SoC of FIG. 1, in accordance with one embodiment of the present invention.

FIG. 4 illustrates, in partial block diagram and partial schematic form, M 236 in accordance with one embodiment of the present invention. M 286 receives the output of shadow latch 234 (i.e. the latched shadow output), and provides a metastable error indicator based on the latched shadow output. M 286 includes a first inverter 402 which is designed as P-dominate so as to have a higher switching threshold than the normal switching range (around midpoint VDD/2) of an inverter, and includes a second inverter 404 which is designed as N-dominate so as to have a lower switching threshold than the normal switching range. The latched shadow output is provided to an input of each of inverter 402 and 404.

An output of inverter 402 is provided as a first data input to a MUX 406, in which a second data input to MUX 406 corresponds to a corresponding test input. A control input of MUX 406 receives a test enable signal which is asserted in test mode in order to provide the test input at a first output of MUX 406 (without a bubble) and negated in functional mode in order to provide the output of inverter 402 to the first output of MUX 406. Note that MUX 406 also includes a second output (with a bubble), corresponding to the complement of the first output. An output of inverter 404 is provided as a first data input to a MUX 408, in which a second data input to MUX 408 corresponds to a corresponding test input. A control input of MUX 408 receives the test enable signal which is asserted in test mode in order to provide the test input at a first output of MUX 408 (without a bubble) and negated in functional mode in order to provide the output of inverter 404 to the first output of MUX 408. Note that MUX 408 also includes a second output (with a bubble), corresponding to the complement of the first output of MUX 408. The first and second outputs of MUX 406 provide the values A and A', respectively, and the first and second outputs of MUX 408 provide the values of B and B', respectively. The value A corresponds to the value of the output of inverter 402 with its corresponding high switching threshold, while the value B corresponds to the value of the output of inverter 404 with its corresponding low switching threshold.

M 286 also includes a comparator portion 410 which implements an XNOR style comparator, in which the metastable error indicator corresponds functionally to "A XNOR B". Comparator portion 410 includes PMOS transistors 412 and 414 coupled in series between VDD and an output node 428 and PMOS transistors 420 and 422 coupled in series between VDD and output node 428. Comparator portion 410 also includes NMOS transistors 416 and 418 in series between output node 428 and VSS and includes NMOS transistors 424 and 426 in series between output node 428 and VSS. The first output of MUX 406 is provided to the control electrodes of transistors 420 and 424, the second output of MUX 408 to the control electrodes of transistors 412 and 416, the first output of MUX 408 to the control electrodes of transistors 422 and 418, and the second output of MUX 408 to the control electrodes of transistors 414 and 426. In this manner, when A and B have the same value, then either transistors 420 and 422 are both on (if A=B=0) or transistors 412 and 414 are both on (if A=B=1), while one of transistors 416 and 418 is off and one of transistors 424 and 426 is off, resulting in output node 428 being pulled to VDD (asserting metastable error to a one). When A and B have different values, then either transistors 416 and 418 are both on or transistors 424 and 426 are both on, while one of transistors 412 and 414 is off and one of transistors 420 and 422 is off, resulting in output node 428 being pulled down to VSS (negating metastable error to a zero).

In operation, during functional mode (e.g. not test mode), the latched shadow output is provided to both inverter 402 and inverter 404. If the latched shadow output is switching within the normal range, then the outputs of inverters 402 and 404 will have different values due to the differences in their switching thresholds. In this case, with A and B having different values, metastable error is negated to a zero, as described above. However, if the latched shadow output is not switching within the normal range due to a metastable fault, the outputs of inverters 402 and 404 will have the same values, resulting in asserting metastable error to a one, indicating occurrence of a metastable error.

Note that each of circuits M 236, compare circuit 242, and OR circuit 238 can be implemented in a variety of ways using different circuitry or elements than those illustrated. For example, any combination of elements may be used to perform the functions of M 236 or the OR function of OR circuit 238. Also, note that MUXes 230 and 232 may be implemented using different circuitry, and may therefore be referred to as selector circuits 230 and 232. Furthermore, the delay generator (e.g. 238, 500) may produce any number of delayed data outputs (e.g. include any number of taps), and therefore, selector circuit 230 may include any number of inputs, and the control value (e.g. S0-S2) can include any number of bits as needed to select a desired delayed data output. Also, while FIG. 2 illustrates delay generator 308 as including a plurality of daisy chained delay units, different circuitry and arrangements may be used to provide the plurality of delayed data outputs with increasing delay. Furthermore, the daisy chaining of the delay units of FIG. 2 can be done by implementing multiple levels of multiplexing to provide improved balance and delay control, but alternatively, other multiplexing schemes can be used.

Note that M 236 can be functionally tested, as needed, by asserting the test enable and using the test inputs instead of the outputs of inverters 402 and 404. Also, as described above in reference to MUX 230 of FIG. 2 and MUXes 406 and 408 of FIG. 4, the monitored data path may also be involved during scan testing. When scan testing is enabled (e.g. when SE is a one), SI is provided to the data input of shadow latch 234, rather than the output of MUX 230. During scan testing, latch 204 of standard flip flop 202 would also be set up to receive a scan input rather than an input from the functional logic connected to standard flip flop 202. Therefore, each of flip flop 202, shadow latch 234, and error latch 240 can be used in as part of a scan chain during scan testing. In one embodiment, since standard flip flop is implemented as a Master-Slave flip flop with latches 204 and 206, shadow latch 234 can be used together with error latch 240 during scan testing to match timing of a master-slave flip flop.

Therefore, by now it can be appreciated how functional data paths can be monitored, as desired, during functional operation in order to generate warnings, or indications of impending failures, such as when a selected setup timing margin for a shadow latch corresponding to a flip flop of the monitored data path can no longer be met. For example, by using a daisy-chained delay chain, the input data provided to the flip flop can also be provided to the corresponding shadow latch but delayed in accordance with a selected delay value. The longer the selected delay value, the shorter the setup timing margin for the shadow latch. If the input data through the standard flip flop does not match the delayed input data captured by the shadow latch, an impending failure is indicated. In one embodiment, a metastability circuit may also be used to indicate when the delayed input data captured by the shadow latch includes a metastability fault, which may also indicate an impending failure. By receiving warnings or indications of impending failure, appropriate action can be taken by the SoC, such as providing maintenance warnings, providing disabling capabilities, or even controlling a shut down or reset process. While the above descriptions were provided in reference to detecting impending failures in the case of aging, the impending failure detection described herein can also be used in other applications, such as to detect impending failure due, for example, to voltage drop, latent defects, operation at high temperatures, etc.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Each signal described herein may be designed as positive or negative logic, where negative logic can be indicated by a bar over the signal name or an asterisk (*) following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Some of the above embodiments, as applicable, may be implemented using a variety of different information processing systems. For example, although FIG. 1 and the discussion thereof describe an exemplary information processing architecture, this exemplary architecture is presented merely to provide a useful reference in discussing various aspects of the invention. Of course, the description of the architecture has been simplified for purposes of discussion, and it is just one of many different types of appropriate architectures that may be used in accordance with the invention. Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. For example, different delay generators may be provided to delay the input data by a programmable delay amount which is immune to ageing effects. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention.

In one embodiment, an integrated circuit includes a critical data path including a flip flop configured to receive a data input and provide a latched data output, and a monitoring circuit coupled to the flip flop. The monitoring circuit includes a delay generator configured to receive the data input and provide a plurality of delayed data outputs wherein the plurality of delay data outputs correspond to delayed versions of the data input with increasing amounts of delay; a selector circuit configured to select one of the plurality of delayed data outputs based on a programmable control value, and having an output; a shadow latch corresponding to the flip flop, having an input coupled to the output of the selector circuit and configured to latch a value at its input to provide as a latched shadow output, wherein each of the flip flop and the shadow latch are clocked by a same clock signal; a comparator circuit configured to provide a match error indicator based on a comparison between the first latched data output from the flip flop and the latched shadow output from the shadow latch; and an error latch configured to latch an error value based at least on the match error indicator and to provide the latched error value as an error indicator, wherein the error indicator indicates whether or not an impending failure of the critical data path is detected. In one aspect, the delay generator includes a plurality of daisy chained delay units configured to receive the data input, wherein each delay unit provides a monotonic delay and outputs a different one of the delayed data outputs. In a further aspect, each of the delay units includes: a data input, a data output, and a transmission gate coupled between the data input and the data output. In yet a further aspect, the transmission gate includes a number of p-type transistors and a number of n-type transistors all in parallel, wherein the number of p-type transistors differs form the number of n-type transistors. In another aspect, each of the delay units includes a data input; a data output; an inverter having a first input coupled to the data input; a resistor having a first terminal coupled to an output of the inverter, and a second terminal coupled to the data output; and a capacitor having a first terminal coupled to the data output. In another aspect of the embodiment, the integrated circuit further includes a metastability detection circuit configured to receive the latched shadow output from the shadow latch and provide a metastability error indicator based on whether or not the latched shadow output indicates a metastability error, wherein the error value is based on the metastability error indicator and the match error indicator. In a further aspect, the latched error value has a first value to indicate the impending failure is detected when either the match error indicator indicates that the first latched data output from the flip flop does not match the latched shadow output from the shadow latch or that the metastability error indicator indicates that the latched shadow output indicates the metastability error, otherwise the latched error value has a second value. In a further aspect, the second value of the latched error value indicates that the impending failure is not detected. In another aspect, the metastability detection circuit includes a first inverter having a first switching threshold configured to receive the latched shadow output and provide a first output and a complement of the first output; a second inverter having a second switching threshold, lower than the first switching threshold, configured to receive the latched shadow output and provide a second output and a complement of the second output; and a comparator portion configured to provide the metastability error indicator based on the first output, complement of the first output, second output, and complement of the second output. In a further aspect, the first switching threshold is greater than a normal switching range of the shadow latch, and the second switching threshold is greater than the normal switching range of the shadow latch such that when the shadow latch switches within the normal switching range, the first output and the second output have different values, and when the shadow latch does not switch within the normal switching range, the first output and the second output have a same value. In yet a further aspect, the first output and the second output having different values indicates that the latched shadow output does not indicate the metastability error, and the first output and the second output having the same value indicates that the latched shadow output does indicate the metastability error. In another aspect of the embodiment, the flip flop is further characterized as a master-slave flip flop having a master latch and a slave latch, wherein during scan testing, the master latch, slave latch, shadow latch, and error latch are each included as part of a scan chain, In another embodiment, an integrated circuit includes a critical data path including a flip flop configured to receive a data input and provide a first latched data output; and a monitoring circuit coupled to the flip flop. The monitoring circuit includes a delay generator configured to receive the data input and provide a plurality of delayed data outputs wherein the plurality of delay data outputs correspond to delayed versions of the data input with increasing amounts of delay; a selector circuit configured to select one of the plurality of delayed data outputs based on a programmable control value and having an output; a shadow latch corresponding to the flip flop, having an input coupled to the output of the selector circuit, and configured to latch a value at its input to provide as a latched shadow output, wherein each of the flip flop and the shadow latch are clocked by a same clock signal; and warning generating circuitry configured to indicate a warning of impending failure of the critical data path when the first latched data output from the flip flop does not match the latched shadow output from the shadow latch or when the latched shadow output indicates presence of a metastability error. In one aspect, the delay generator includes a plurality of daisy chained delay units configured to receive the data input, wherein each delay unit provides a monotonic delay and outputs a different one of the delayed data outputs, and wherein the programmable control value selects an output of one of the daisy chained delay units. In a further aspect, each of the delay units includes a data input, a data output, and a transmission gate coupled between the data input and the data output. In another aspect, the programmable control value is set to select a daisy chained delay unit of the plurality of daisy chained delay units which provides a minimum setup margin for the shadow latch which still allows proper operation of the critical data path. In another aspect of the another embodiment, the warning generating circuitry includes a compare circuit configured to indicate whether or not the first latched data output matches the latched shadow output; and a metastability detection circuit which includes a first inverter having a first switching threshold configured to receive the latched shadow output and provide a first output and a complement of the first output; a second inverter having a second switching threshold, lower than the first switching threshold, configured to receive the latched shadow output and provide a second output and a complement of the second output; and a comparator portion configured to indicate whether or not the latched shadow output indicates the presence of the metastability error based on the first output, complement of the first output, second output, and complement of the second output.

In yet another embodiment, in an integrated circuit having a critical data path and a monitoring circuit coupled to a flip flop of the critical data path, a method includes providing data to the flip flop and latching the data at a first clock edge; while providing the data to the flip flop, also providing a delayed version of the data to a shadow latch corresponding to the flip flop, and latching an input value of the shadow latch at the first clock edge; comparing the latched data of the flip flop to the latched input value of the shadow latch to determine whether a mismatch occurs; determining whether the latched input value of the shadow latch indicates a metastability error; and asserting a warning indicator if either the mismatch occurs or the latched input value indicates the metastability error. In one aspect, the method further includes setting a programmable control value to select a delay for the data; wherein providing the delayed version of the data to the shadow latch is performed such that the data is delayed by the selected delay, wherein the programmable control value corresponds to an output of a selected delay unit of a plurality of daisy chained delay units. In a further aspect, determining whether the latched input value of the shadow latch indicates the metastability error includes providing the latched input value of the shadow latch to each of a first inverter and a second inverter, the first inverter having a switching threshold greater than a normal switching range of the shadow latch and the second inverter having a switching threshold less than the normal switching range of the shadow latch; and using outputs of each of the first inverter and the second inverter to determine whether the latched input value of the shadow latch indicates the metastability error.

What is claimed is:

1. An integrated circuit, comprising:
   a critical data path including a flip flop configured to receive a data input and provide a latched data output; and
   a monitoring circuit coupled to the flip flop, the monitoring circuit comprising:
   a delay generator configured to receive the data input and provide a plurality of delayed data outputs wherein the plurality of delay data outputs correspond to delayed versions of the data input with increasing amounts of delay;
   a selector circuit configured to select one of the plurality of delayed data outputs based on a programmable control value, and having an output;
   a shadow latch corresponding to the flip flop, having an input coupled to the output of the selector circuit and configured to latch a value at its input to provide as a latched shadow output, wherein each of the flip flop and the shadow latch are clocked by a same clock signal;
   a comparator circuit configured to provide a match error indicator based on a comparison between the first latched data output from the flip flop and the latched shadow output from the shadow latch; and
   an error latch configured to latch an error value based at least on the match error indicator and to provide the latched error value as an error indicator, wherein the error indicator indicates whether or not an impending failure of the critical data path is detected.

2. The integrated circuit of claim 1, wherein the delay generator comprises:
   a plurality of daisy chained delay units configured to receive the data input, wherein each delay unit provides a monotonic delay and outputs a different one of the delayed data outputs.

3. The integrated circuit of claim 2, wherein each of the delay units comprises:
   a data input, a data output, and a transmission gate coupled between the data input and the data output.

4. The integrated circuit of claim 3, wherein the transmission gate includes a number of p-type transistors and a number of n-type transistors all in parallel, wherein the number of p-type transistors differs form the number of n-type transistors.

5. The integrated circuit of claim 2, wherein each of the delay units comprises:
   a data input;
   a data output;
   an inverter having a first input coupled to the data input;
   a resistor having a first terminal coupled to an output of the inverter, and a second terminal coupled to the data output; and
   a capacitor having a first terminal coupled to the data output.

6. The integrated circuit of claim 1, further comprising:
   a metastability detection circuit configured to receive the latched shadow output from the shadow latch and provide a metastability error indicator based on whether or not the latched shadow output indicates a metastability error;
   wherein the error value is based on the metastability error indicator and the match error indicator.

7. The integrated circuit of claim 6, wherein the latched error value has a first value to indicate the impending failure is detected when either the match error indicator indicates that the first latched data output from the flip flop does not match the latched shadow output from the shadow latch or that the metastability error indicator indicates that the latched shadow output indicates the metastability error, otherwise the latched error value has a second value.

8. The integrated circuit of claim 7, wherein the second value of the latched error value indicates that the impending failure is not detected.

9. The integrated circuit of claim 6, wherein the metastability detection circuit comprises:
   a first inverter having a first switching threshold configured to receive the latched shadow output and provide a first output and a complement of the first output;
   a second inverter having a second switching threshold, lower than the first switching threshold, configured to receive the latched shadow output and provide a second output and a complement of the second output; and
   a comparator portion configured to provide the metastability error indicator based on the first output, complement of the first output, second output, and complement of the second output.

10. The integrated circuit of claim 9, wherein the first switching threshold is greater than a normal switching range of the shadow latch, and the second switching threshold is greater than the normal switching range of the shadow latch such that when the shadow latch switches within the normal switching range, the first output and the second output have different values, and when the shadow latch does not switch within the normal switching range, the first output and the second output have a same value.

11. The integrated circuit of claim 10, wherein the first output and the second output having different values indicates that the latched shadow output does not indicate the metastability error, and the first output and the second output having the same value indicates that the latched shadow output does indicate the metastability error.

12. The integrated circuit of claim 1, wherein the flip flop is further characterized as a master-slave flip flop having a master latch and a slave latch, wherein during scan testing, the master latch, slave latch, shadow latch, and error latch are each included as part of a scan chain.

13. An integrated circuit, comprising:
- a critical data path including a flip flop configured to receive a data input and provide a first latched data output; and
- a monitoring circuit coupled to the flip flop, the monitoring circuit comprising:
  - a delay generator configured to receive the data input and provide a plurality of delayed data outputs wherein the plurality of delay data outputs correspond to delayed versions of the data input with increasing amounts of delay;
  - a selector circuit configured to select one of the plurality of delayed data outputs based on a programmable control value and having an output;
  - a shadow latch corresponding to the flip flop, having an input coupled to the output of the selector circuit, and configured to latch a value at its input to provide as a latched shadow output, wherein each of the flip flop and the shadow latch are clocked by a same clock signal; and
  - warning generating circuitry configured to indicate a warning of impending failure of the critical data path when the first latched data output from the flip flop does not match the latched shadow output from the shadow latch or when the latched shadow output indicates presence of a metastability error.

14. The integrated circuit of claim 13, wherein the delay generator comprises:
- a plurality of daisy chained delay units configured to receive the data input, wherein each delay unit provides a monotonic delay and outputs a different one of the delayed data outputs, and wherein the programmable control value selects an output of one of the daisy chained delay units.

15. The integrated circuit of claim 14, wherein each of the delay units comprises:
- a data input, a data output, and a transmission gate coupled between the data input and the data output.

16. The integrated circuit of claim 14, wherein the programmable control value is set to select a daisy chained delay unit of the plurality of daisy chained delay units which provides a minimum setup margin for the shadow latch which still allows proper operation of the critical data path.

17. The integrated circuit of claim 13, wherein the warning generating circuitry comprises:
- a compare circuit configured to indicate whether or not the first latched data output matches the latched shadow output; and
- a metastability detection circuit comprising:
  - a first inverter having a first switching threshold configured to receive the latched shadow output and provide a first output and a complement of the first output;
  - a second inverter having a second switching threshold, lower than the first switching threshold, configured to receive the latched shadow output and provide a second output and a complement of the second output; and
  - a comparator portion configured to indicate whether or not the latched shadow output indicates the presence of the metastability error based on the first output, complement of the first output, second output, and complement of the second output.

18. In an integrated circuit having a critical data path and a monitoring circuit coupled to a flip flop of the critical data path, a method comprising:
- providing data to the flip flop and latching the data at a first clock edge;
- while providing the data to the flip flop, also providing a delayed version of the data to a shadow latch corresponding to the flip flop, and latching an input value of the shadow latch at the first clock edge;
- comparing the latched data of the flip flop to the latched input value of the shadow latch to determine whether a mismatch occurs;
- determining whether the latched input value of the shadow latch indicates a metastability error; and
- asserting a warning indicator if either the mismatch occurs or the latched input value indicates the metastability error.

19. The method of claim 18, further comprising:
- setting a programmable control value to select a delay for the data; wherein providing the delayed version of the data to the shadow latch is performed such that the data is delayed by the selected delay, wherein the programmable control value corresponds to an output of a selected delay unit of a plurality of daisy chained delay units.

20. The method of claim 19, wherein determining whether the latched input value of the shadow latch indicates the metastability error comprises:
- providing the latched input value of the shadow latch to each of a first inverter and a second inverter, the first inverter having a switching threshold greater than a normal switching range of the shadow latch and the second inverter having a switching threshold less than the normal switching range of the shadow latch; and
- using outputs of each of the first inverter and the second inverter to determine whether the latched input value of the shadow latch indicates the metastability error.

* * * * *